United States Patent [19]
Taki et al.

[11] Patent Number: 6,020,570
[45] Date of Patent: Feb. 1, 2000

[54] PLASMA PROCESSING APPARATUS

[75] Inventors: Masakazu Taki; Hiroki Ootera; Tatsuo Oomori; Kazuyasu Nishikawa; Kenji Shintani, all of Tokyo, Japan

[73] Assignee: Mitsubishi Denki Kabushiki Kaisha, Tokyo, Japan

[21] Appl. No.: 09/003,784

[22] Filed: Jan. 7, 1998

[30] Foreign Application Priority Data

Feb. 3, 1997 [JP] Japan ................................. 9-020550

[51] Int. Cl.[7] ............................................... B23K 9/00
[52] U.S. Cl. ............................. 219/121.43; 118/723 MP
[58] Field of Search ........................ 219/121.43, 121.11, 219/121.4, 121.39, 121.42, 121.48; 118/723 I, 723 MP; 156/345

[56] References Cited

U.S. PATENT DOCUMENTS

| | | | |
|---|---|---|---|
| 4,134,817 | 1/1979 | Bourdon | 204/192 |
| 4,362,632 | 12/1982 | Jacob | 422/183.04 |
| 4,412,119 | 10/1983 | Komatsu et al. | 219/121 |
| 5,061,838 | 10/1991 | Lane et al. | 219/121.59 |
| 5,284,544 | 2/1994 | Mizutani et al. | 156/345 |
| 5,292,370 | 3/1994 | Tsai et al. | 118/723 MP |
| 5,359,177 | 10/1994 | Taki et al. | . |
| 5,487,875 | 1/1996 | Suzuki | 422/186.05 |
| 5,669,975 | 9/1997 | Ashtiani | 118/723 I |
| 5,698,062 | 12/1997 | Sakamoto et al. | 156/345 |
| 5,811,022 | 9/1998 | Savas et al. | 216/68 |

FOREIGN PATENT DOCUMENTS 7-78805  3/1995  Japan .

*Primary Examiner*—John A. Jeffery
*Assistant Examiner*—Quang Van
*Attorney, Agent, or Firm*—Sughrue, Mion, Zinn, Macpeak & Seas, PLLC

[57] ABSTRACT

A plasma is supplied from a plasma source to a space between an upper electrode plate and a lower electrode plate disposed opposite to and in parallel with the upper electrode plate when producing a plasma in the space between the electrode plates for plasma processing by applying radio-frequency power to the electrode plates. The plasma source produce a plasma by inductively coupled discharge, radio-frequency discharge or microwave discharge. A plasma processing apparatus is obtained which is capable of producing a parallel-plate plasma by discharge in a space of a relatively low pressure and is capable of processing a large diameter workpiece uniformly at a high processing rate.

7 Claims, 6 Drawing Sheets

PLASMA PROCESSING APPARATUS

BACKGROUND OF THE INVENTION

1. Field of the Invention

The present invention relates to a plasma processing apparatus which uses a plasma for forming a thin film on a surface of a workpiece or for etching a surface of a workpiece to fabricate a semiconductor device.

2. Description of Prior Art

FIG. 6 shows a schematic sectional view of an example of a conventional dry etching apparatus disclosed in JP-A No. 7-78805. In FIG. 6, a lower RF (radio-frequency) electrode plate 11 is disposed in a lower portion of the interior of a vacuum vessel 10. The lower RF electrode plate 11 is disposed not to contact directly with the vacuum vessel 10, but is electrically isolated from the vacuum vessel 10 by an insulating member 21. An upper RF electrode plate 12 is connected electrically to the vacuum vessel 10 and is kept at a ground potential. A semiconductor wafer 13, i.e., a workpiece, is mounted on the lower RF electrode plate 11. A reactive gas inlet 14 is formed in the upper wall of the vacuum vessel 10. A reactive gas, i.e., a process gas, is supplied through the reactive gas inlet 14 into the vacuum vessel 10. A reactive gas outlet 15 is formed on the bottom wall of the vacuum vessel 10. The reactive gas is discharged from the vacuum vessel 10 through the reactive gas outlet 15. The lower RF electrode plate 11 is internally provided with a refrigerant pipe 16 for cooling the lower RF electrode plate 11 so that the lower RF electrode plate 11 is held at a fixed temperature. The refrigerant pipe 16 has one end serving as a refrigerant inlet 17 and the other end serving as a refrigerant outlet 18. The lower RF electrode plate 11 is connected to a RF power supply 20 by a coupling capacitor 19. In the vacuum vessel 10, a plasma 7 is generated between the lower and upper electrodes 11 and 12.

In operation, a reactive gas is supplied through the reactive gas inlet 14 into the vacuum vessel 10, while the vacuum vessel 10 is evacuated through the reactive gas outlet 15 so that the interior of the vacuum vessel 10 is kept at a predetermined pressure. Then, an RF voltage is applied to the lower RF electrode plate 11 by the RF power supply 20. Consequently, the discharge occurs between the parallel RF electrode plates 11 and 12 to produce a plasma in a space between the parallel RF electrode plates 11 and 12. The plasma 7 thus produced is used for dry-etching the semiconductor wafer 13.

In the conventional plasma processing apparatus thus constructed, the plasma 7 is produced in a space between the lower RF electrode plate 11 and the upper RF electrode plate 12. Therefore, the conventional plasma processing apparatus has an advantage of producing a uniform plasma in a large area by a simple arrangement. However, the conventional plasma processing apparatus has the following disadvantages.

In order to form a minute pattern accurately by dry-etching on the semiconductor wafer 13, anisotropic etching must be achieved by using a reactive gas at a low pressure to increase particles which fall on the semiconductor wafer 13 perpendicularly to the surface of the semiconductor wafer 13. For example, according to Kazuo Akashi, "*Optics Plasma Processing*", Nikkan Kogyo Shimbun-sha, p. 234, an appropriate pressure of the reactive gas for anisotropic plasma etching is about $1.33 \times 10^{-3}$ Torr).

However, in the conventional plasma processing apparatus, the pressure range of the reactive gas is limited. The discharge occurs between the parallel RF electrode plates 11 and 12 when RF power is supplied to the parallel RF electrode plates 11 and 12. A parallel-plate plasma etching apparatus needs a relatively high gas pressure to sustain discharge and, for example, according to Kazuo Akashi, "*Optics Plasma Processing*", Nikkan Kogyo Shimbunsha, p. 234, a suitable gas pressure is in the range of 13.3 to 1.33 Pa ($1 \times 10^{-1}$ to $1 \times 10^{-2}$ Torr).

Therefore, dry etching cannot be carried out in an environment of a high vacuum in which the gas pressure is relatively low.

SUMMARY OF THE INVENTION

The present invention has been made to solve the foregoing problems, and it is an object of the present invention to provide a plasma processing apparatus capable of producing a plasma in a space by discharge in an environment of a relatively low pressure and capable of processing a semiconductor wafer of a relatively large diameter rapidly in an environment of a high vacuum.

According to one aspect of the present invention, a plasma processing apparatus comprises a processing vessel having a processing chamber containing an upper electrode plate and a lower electrode plate disposed opposite to an in parallel to the upper electrode plate. In the processing vessel, a radio-frequency voltage is applied across the upper electrode plate and the lower electrode plate to produce and sustain a plasma, for processing, by ionizing a process gas by discharge between the upper and lower electrode plates. Said plasma processing apparatus further comprises a plasma source means disposed so as to surround the upper and lower electrode plates to produce a plasma and to supply the plasma into a space between the upper and the lower electrode plates.

In one alternative of the plasma processing apparatus, said plasma source means comprises an annular plasma producing structure surrounding the processing chamber, which has openings in the inner wall open into the processing chamber, and further has a radio-frequency power feed window on the other side. A radio-frequency coil is disposed around the radio-frequency power feed window of the annular plasma producing structure. A plasma is produced in the plasma producing chamber by inductively coupled discharge caused by the radio-frequency coil and the radio-frequency power feed window, and the plasma is supplied through the openings into a space between the upper and lower electrode plate in the processing chamber.

In another alternative of the plasma processing apparatus, said plasma source means comprises an annular plasma producing structure surrounding the processing chamber, which has openings in the inner wall open into the processing chamber, and further provided with an annular discharge electrode disposed opposite to the inner wall. A plasma is produced in the plasma producing chamber by radio-frequency discharge between an inner wall of the plasma producing structure and the annular discharge electrode, and the plasma is supplied through the openings into a space between the upper and the lower electrode plate in the processing chamber.

In another alternative of the plasma processing apparatus, said plasma source means comprises an annular plasma producing structure surrounding the processing chamber, which has openings in the inner wall open, into the processing chamber, and further has a microwave power feed window on the other side. An annular waveguide surrounds the microwave power feed window of the annular plasma producing structure. A plasma is produced in the plasma producing chamber by a microwave propagating through the annular waveguide, and the plasma is supplied through the openings into a space between the upper and lower electrode plates in the processing chamber.

In the plasma processing apparatuses as described above, the process gas may be preferably supplied intermittently into the plasma producing chamber.

Other and further objects, features and advantages of the present invention will appear more fully from the following description.

DESCRIPTION OF THE PREFERRED EMBODIMENTS

Figure 1:
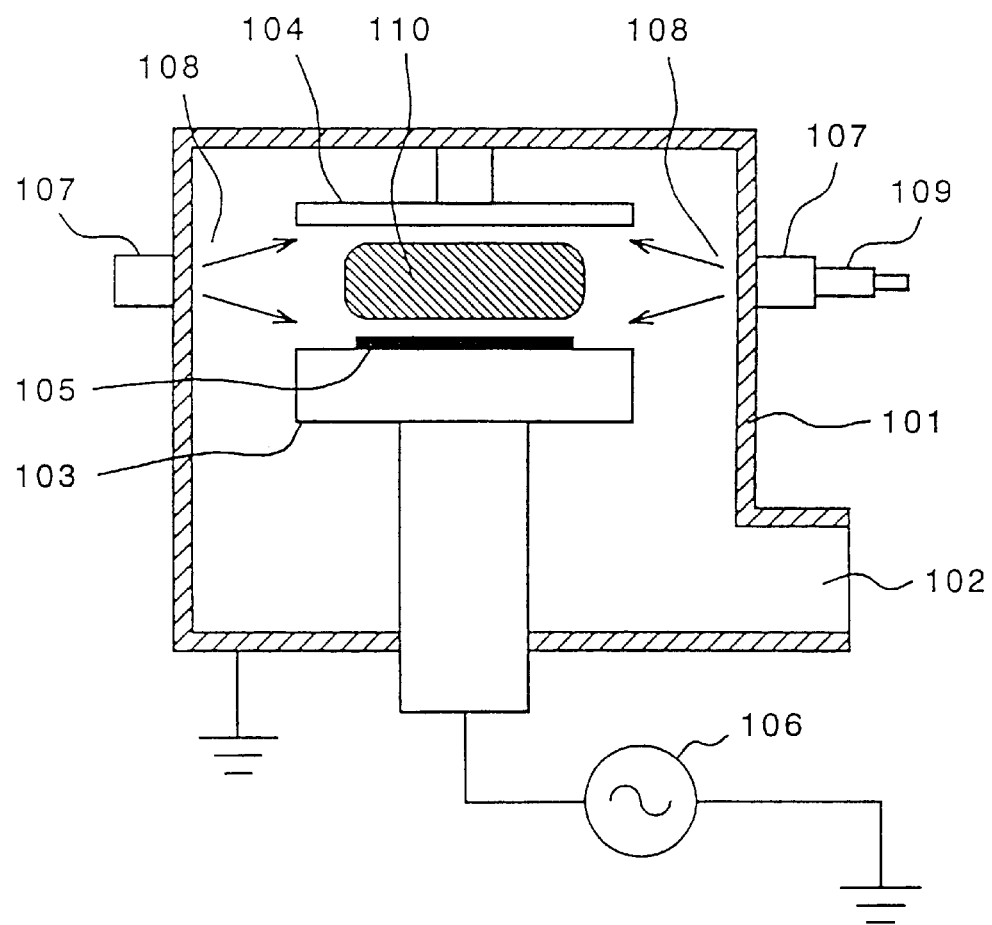
FIG. 1 shows a sectional view of a dry-etching apparatus according to a first embodiment of the present invention.

This invention will be described in further detail by way of examples with reference to the accompanying drawings, in which like reference numerals indicate same or like parts.
First Embodiment The plasma processing apparatus of a first embodiment according to the present invention is a dry-etching apparatus. Referring to FIG. 1 showing the dry-etching apparatus in a sectional view, there are shown a processing vessel 101 having a processing chamber, a gas outlet 102, a lower electrode plate 103 disposed within the processing vessel 101 and supporting a wafer 105, and an upper electrode plate 104 disposed opposite to the lower electrode plate 103 within the processing vessel 101. The lower electrode plate 103 is connected hermetically to and electrically insulated from the processing vessel 101. The upper electrode plate 104 is electrically connected to the processing vessel 101 and is held at a ground potential. Shown also in FIG. 1 are an RF power supply 106 for applying an RF voltage to the lower electrode plate 103, a plasma source 107 provided with a plurality of opening 108 open into the processing vessel 101, and a pulse valve 109 for intermittently supplying a process gas, such as an etching gas, into the processing vessel 101. A plasma 110 is produced in a space between the lower electrode plate 103 and the upper electrode plate 104. The plasma source 107 is sealed hermetically so that a gas supplied into the plasma source 107 may not leak outside and may flow into the processing vessel 101.

In this dry-etching apparatus, an etching gas supplied into the plasma source 107 is ionized by an excitation source to produce a plasma, as described in detail later. The plasma produced by the plasma source 108 is jetted through the plurality of openings 108 into the space between the upper electrode plate 104 and lower electrode plate 103 in the processing vessel 101. When an RF voltage is applied to the lower electrode plate 103, discharge occurs between the upper electrode plate 104 and the lower electrode plate 103, so that a confined plasma produced and the wafer 105 is supported in the lower electrode plate 103 is etched. Since a confined plasma is produced, the wafer 105 may be of a large diameter.

Figure 2:
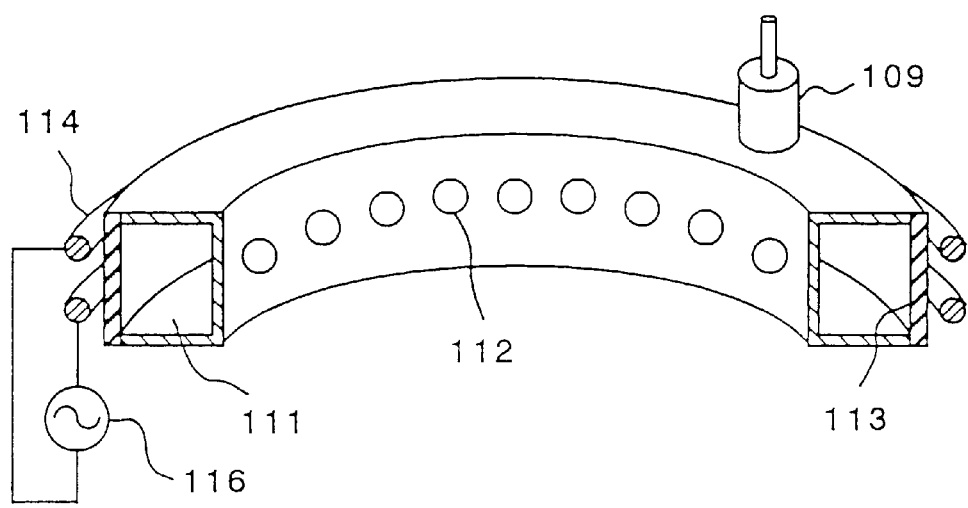
FIG. 2 shows a partial view of a plasma source employed in the dry-etching apparatus according to the first embodiment of the present invention.

The plasma source 107 employed in this embodiment will be described in detail. FIG. 2 shows a portion of the plasma source 107 employed in the dry-etching apparatus. This plasma source 107 uses RF inductively coupled discharge as means for exciting a plasma.

Referring to FIG. 2, a plasma producing ring 111 is disposed around the wall of the processing vessel 101 (FIG. 1) and is provided with a plurality of substantially circular openings 112 and an RF power feed window 113 of a dielectric material, such as quartz glass or a ceramic material. The R power feed window 113 is attached hermetically to the plasmas producing ring 111. Two turns of an RF coil 114 are wound helically around the RF power feed window 113, i.e., around the side wall of the plasma producing ring 111 on the side of the atmosphere. The number of turns and the shape of the RF coil 114, and the distance between the plasma producing ring 111 and the RF coil 114 are determined taking into consideration the size and the plasma characteristics of the plasma producing ring 111. RF power is fed to the RF coil 114 by a second RF power supply 116.

The pulse valve 109 is operated to supply an etching gas, such as chlorine gas, intermittently into the plasma producing ring 111. The etching gas flows through the plurality of openings 112 of the plasma producing ring 111 into the processing vessel 101 through the openings 108 shown in FIG. 1. Namely, the openings 112 and the openings 108 coincides with each other. The etching gas is then discharged from the processing vessel 101 through the gas outlet 102 (FIG. 1).

RF power is supplied to the RF coil 114 by the RF power supply 116. The RF power is then supplied into the plasma processing vessel 111 through the annular RF power feed window 113 by inductive coupling to produce a plasma. The plasma thus produced is jetted through the plurality of openings 112 of the plasma producing ring 111 into the processing vessel 101 by the pressure difference between the plasma producing ring 111 and the processing vessel 101.

The etching gas may be continuously supplied into the plasma producing ring 111 without using the pulse valve 109. This embodiment uses the pulse valve 109 to supply the etching gas intermittently into the plasma producing ring 111, because the plasma can be more efficiently jetted through the plurality of openings 112 into the processing vessel 101 when the etching gas is supplied intermittently. As mentioned in prior Japanese Patent Application No. 6-50536, "Plasma Processing Apparatus", a large pressure difference between the plasma producing ring 111 and the processing vessel 101 can be maintained, and the plasma can be jetted through the openings 112 at a high velocity and at a high rate, if the pulse valve is operated to supply the gas intermittently into the plasma producing ring 111. A greater than ten-fold pressure differential may be maintained, and the plasma can thus be jetted strongly. Consequently, the plasma can be surely delivered to the central portion of the space between the electrode plates 103 and 104 to fill the space to a high plasma density.

When an RF voltage is supplied to the lower electrode plate 103 after the plasma gas has been jetted through the plurality of openings 112 into the processing vessel 101 as shown in FIG. 1, the plasma 110 is confined within the space between the upper electrode plate 104 and the lower electrode plate 103. In this state, discharge between the upper electrode plate 104 and the lower electrode plate 103 can be sustained, even if the processing vessel 101 is evacuated to a high vacuum at which discharge between parallel plates cannot usually be sustained, such as about $1.33\times10^{-1}$ Pa ($1\times10^{-3}$ Torr). This is because the plasma gas jetted from the plasma producing ring 111 serves as a discharge seed for sustaining discharge between the parallel electrode plates 103 and 104. Thus, discharge can be sustained in an environment of lower pressure.

For example, if the temporal average pressure in the plasma producing ring 111 is set at about 1.33 Pa ($1\times10^{-2}$ Torr), the temporal average pressure in the processing chamber 101 will be about $1.33\times10^{-1}$ Pa ($1\times10^{-3}$ Torr), and the plasma can be confined and sustained in the space between the electrode plates 103 and 104. Consequently, wafers of a large diameter can be uniformly processed at a high processing rate.

The etching apparatus in this embodiment was used to etch a polysilicon film formed on a wafer 105 of eight inch diameter to form gate circuits of a semiconductor device. The polysilicon film could be etched at an etching rate of about 100 nm/min, and the uniformity of the etching rate across the surface of the wafer 105 was +/-5%.

Figure 3:
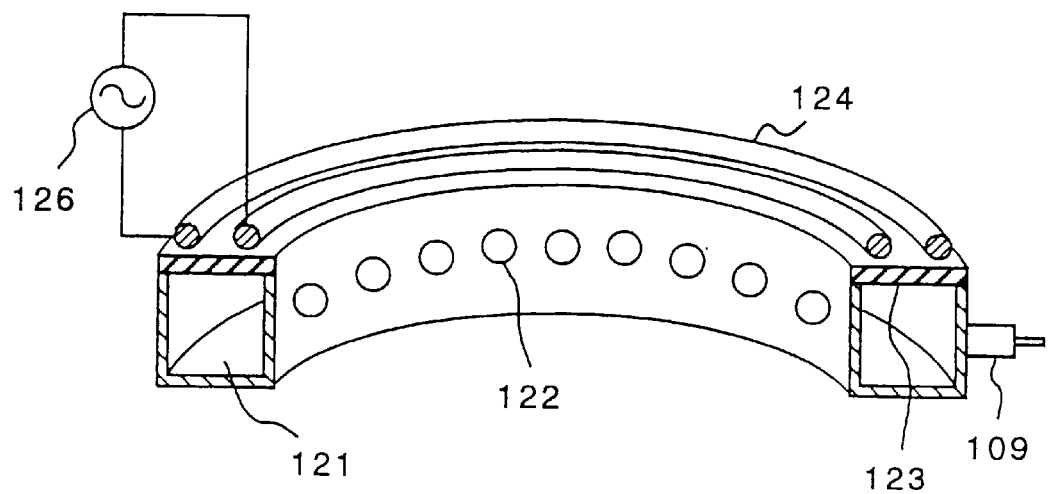
FIG. 3 shows a partial view of another plasma source employed in the dry-etching apparatus according to the first embodiment of the present invention.

An RF coil 124 disposed as shown in FIG. 3 may be used instead of the RF coil 114 disposed as shown in FIG. 2. In FIG. 3, a plasma producing ring 121 is disposed so as to surround the wall of the processing vessel 101 and is provided with a plurality of openings 122 and an RF power feed window 123 hermetically attached to the plasma producing ring 121. Two turns of RF coil 124 are wound spirally on the RF window 123. RF power is supplied to the RF coil 124 by a second RF power supply 126. The arrangement shown in FIG. 3 operates similarly to the arrangement shown in FIG. 2 and achieves the same effects as in the arrangement shown in FIG. 2.

The number and the size of the openings 112 or 122 are dependent on the capacity of the vacuum pump, not shown, for evacuating the processing vessel 101, the rate of supply of the process gas through the pulse valve 109, and the pressure differential between the processing vessel 101 and the plasma producing ring 111 or 121.

Second Embodiment

Figure 4:
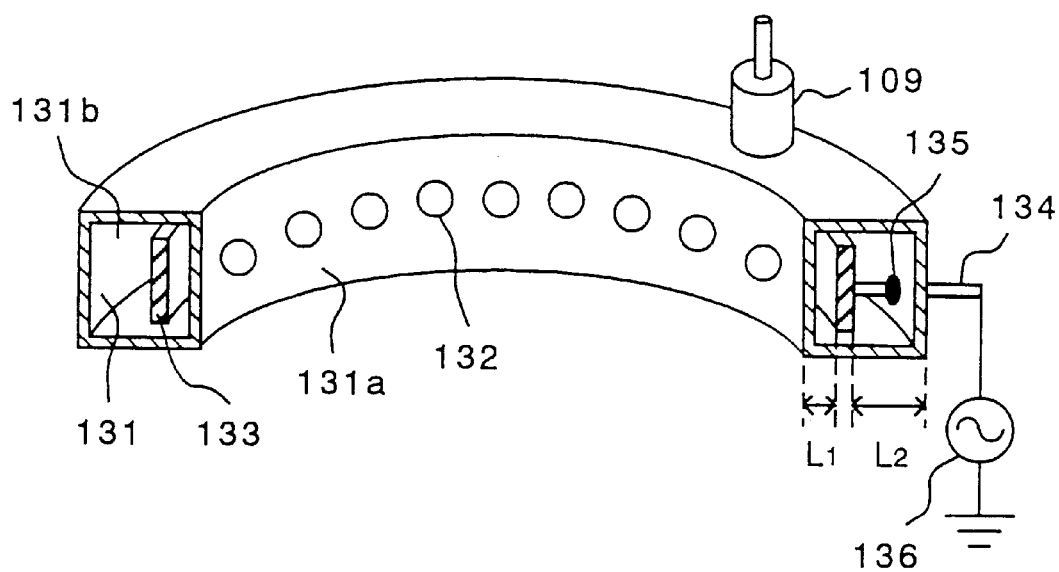
FIG. 4 shows a partial view of a plasma source employed in the dry-etching apparatus according to a second embodiment of the present invention.

A plasma processing apparatus according to the second embodiment according to the present invention will be described hereinafter. The plasma processing apparatus in the second embodiment is an etching apparatus. FIG. 4 shows a portion of the plasma source employed in the etching apparatus of the second embodiment.

Referring to FIG. 4, a plasma producing ring 131 is disposed so as to surround the side wall of a processing vessel 101. The plasma producing ring 131 has an inner side wall 131a provided with a plurality of openings 132, and an outer side wall 131b, and is provided with an annular RF electrode 133 disposed between the inner and the outer side walls opposite to the plurality of openings 132. The inner side wall 131a provided with the openings 132, the outer side wall 131b and the RF electrode 133 are arranged concentrically. The thickness L1 of an annular space between the inner side wall 131a and the RF electrode 133 is smaller than the thickness L2 of an annular space between the outer side wall 131b and the RF electrode 133.

The RF electrode 133 is connected to a second RF power supply 136 via connection 155 by RF power feeder 134 which is hermetically joined to the outer side wall 131b of the plasma producing ring 131.

While the plasma producing operation of the plasma producing ring 131 of the etching apparatus of the second embodiment is different from that of the plasma producing rings 111 or 121 of the etching apparatus of the first embodiment, the construction of the apparatus as a whole is similar to that of the first embodiment. The etching apparatus of the second embodiment processes a wafer 105 by a plasma-producing operation similar to that carried out by the etching apparatus of the first embodiment.

Chlorine gas supplied through a pulse valve 109 into the plasma producing ring 131 is ionized by the plasma producing ring 131 to produce a plasma, and the plasma is jetted through the plurality of openings 132 into the processing vessel 101 evacuated to a high vacuum to etch the wafer 105 through the openings 108 shown in FIG. 1. Namely, the openings 132 and the openings 108 coincide with each other.

In the plasma producing ring 131, when RF voltage is applied to the RF electrode 133 by the RF power supply 136, a plasma is produced in an annular space between the RF electrode 133 and the inner side wall 131a. The RF electrode 133 is disposed, so as to satisfy L1<L2, closer to the inner side wall 131a provided with the openings 132, whereby efficient discharge is attained between the RF electrode 133 and the inner side wall 131a to produce the plasma in the vicinity of openings 132. Since the inner side wall 131a and the RF electrode 133 are concentric, the plasma is produced uniformly around the processing vessel 101.

As mentioned above, the discharge sustaining pressure required of a parallel-plate plasma etching apparatus is, for example, in the range of about 13.3 to 1.33 Pa ($1\times10^{-1}$ to $1\times10^{-2}$ Torr). The pressure in the plasma producing ring 131 is maintained at a pressure in the foregoing range. The plasma is jetted through the openings 132 into the space between electrode plates 103 and 104 in the processing vessel 101 and serves as a seed for initiating and sustaining discharge. Therefore, discharge can be started between the electrode plates 103 and 104 in a high vacuum on the order of $1.33\times10^{-3}$ Pa ($1\times10^{-3}$ Torr). Consequently, films formed on the wafer of a large diameter can be uniformly processed by the plasma at a high processing rate.

Third Embodiment

Figure 5:
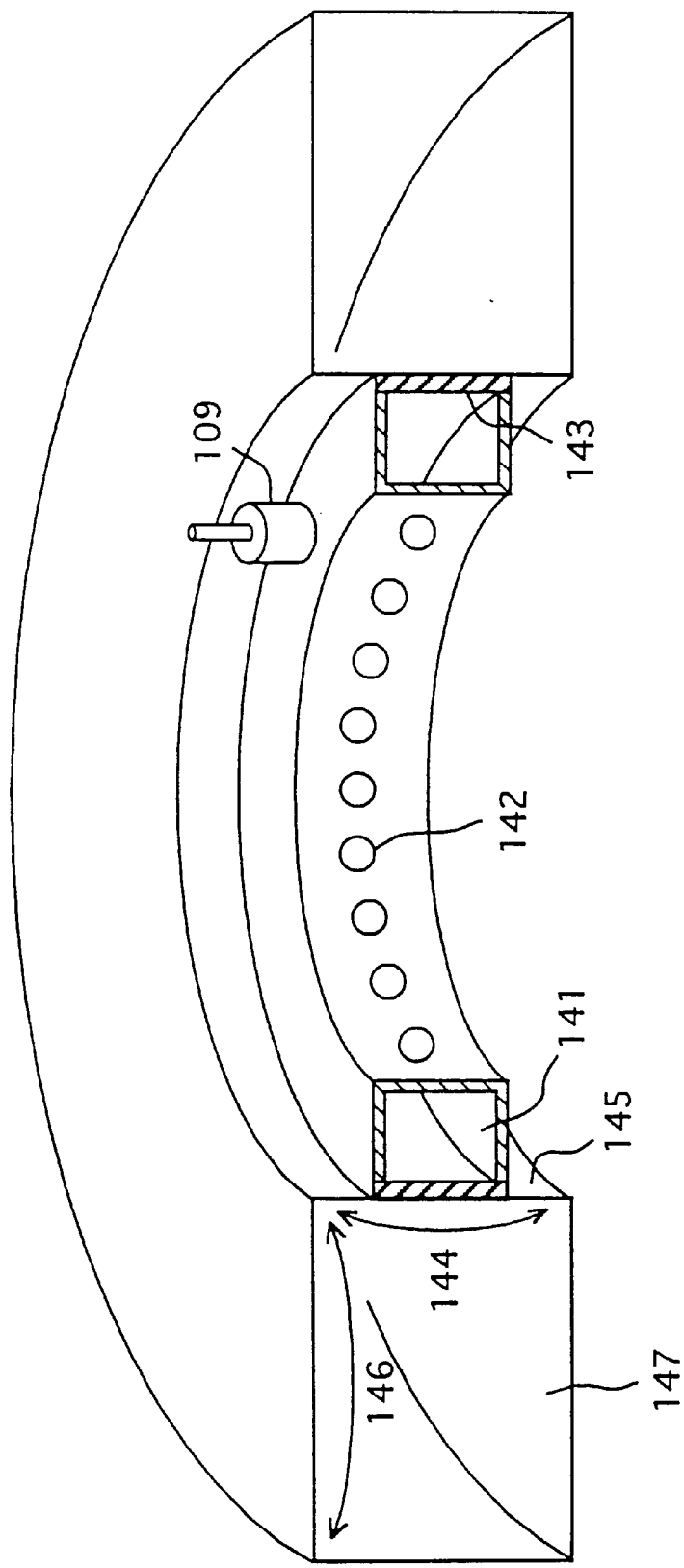
FIG. 5 shows a partial view of a plasma source employed in the dry-etching apparatus according to a third embodiment of the present invention.
Figure 6:
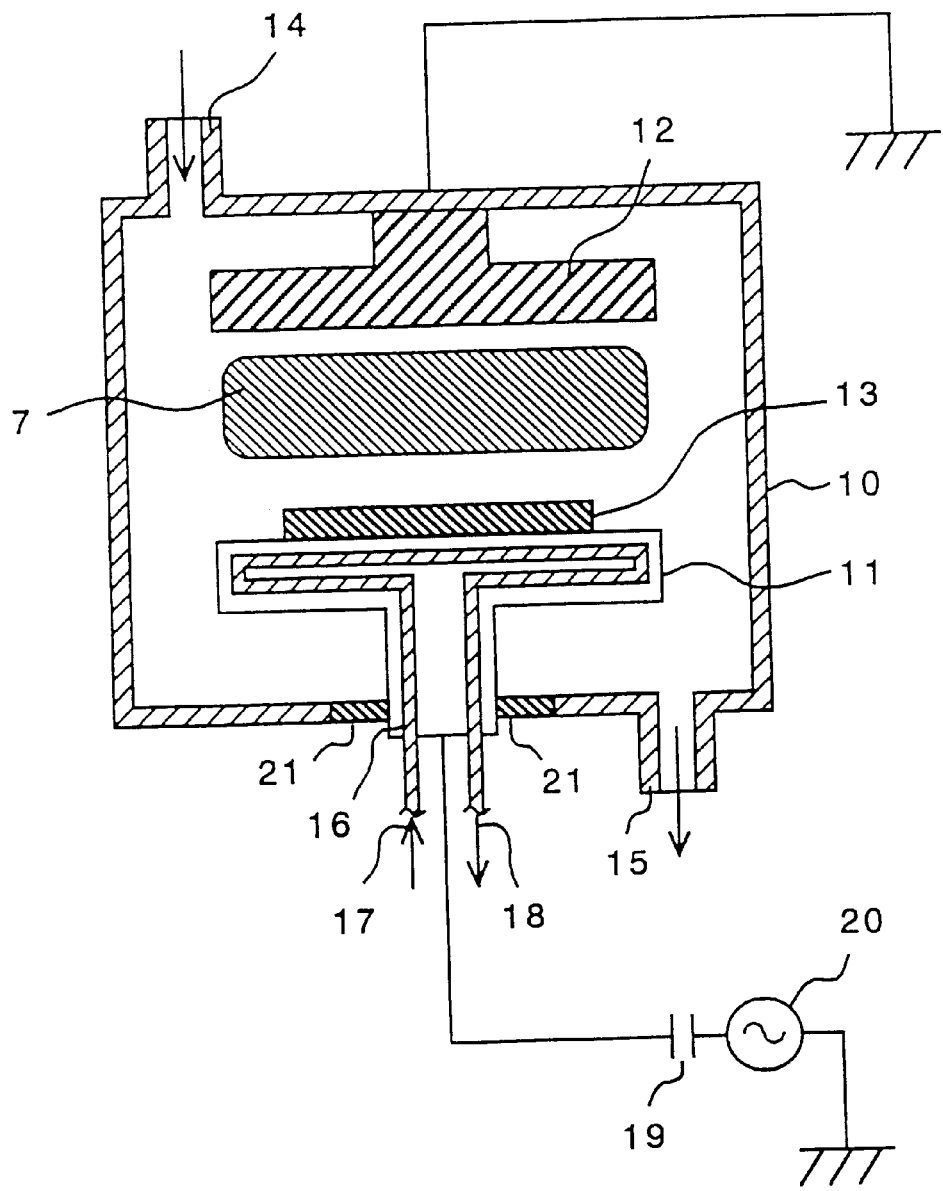
FIG. 6 shows a schematic sectional view of an example of a conventional dry etching apparatus.

A plasma processing apparatus of a third embodiment according to the present invention will be described hereinafter. The plasma processing apparatus of the third embodiment is an etching apparatus. FIG. 5 shows a portion of a plasma source employed in this etching apparatus.

Referring to FIG. 5, a plasma producing ring 141 has an inner side wall provided with a plurality of openings 142 to open into a processing vessel 101, and a microwave power feed window 143 of a dielectric, such as quartz glass or ceramic glass. The microwave power feed window 143 is attached hermetically to the plasma producing ring 141. An annular waveguide 147 is disposed so as to surround the microwave power feed window 143.

The annular waveguide 147 is formed of a metal, such as copper or aluminum, and is disposed so that its conductive inner side wall 145 corresponding to the E-plane 144 is in contact with the microwave power feed window 143. The E-plane 144 is formed by a portion of the conductive inner side wall 145 and the microwave power feed window 143. The E-plane an the H-plane 146 form the annular waveguide 147. A microwave applied to the annular waveguide 147 propagates through the annular waveguide 147.

The plasma producing operation of the plasma producing ring 141 of the etching apparatus of the third embodiment is different from that of the plasma producing rings 111 or 131 of the etching apparatus of the first or the second embodiments. However, the etching apparatus in the third embodiment is the same in construction as the etching apparatus of the first embodiment, and processes a wafer 105 by a plasma-processing operation similar to that carried out by the etching apparatus in the first embodiment.

Chlorine gas supplied through a pulse valve 109 into the plasma producing ring 141 is ionized by the plasma producing ring 141 to produce plasma, and the plasma is jetted through the plurality of openings 142 into the processing vessel 101 by the pressure difference between the plasma producing ring 141 an the processing vessel 101 through the openings 108 shown in FIG. 1. The RF voltage is applied to the lower electrode plate 103, the plasma 110 is confined in a space between the upper electrode plate 104 and the lower electrode plate 103.

If a microwave is made to propagate through the annular waveguide 147 by a method as disclosed in U.S. Pat. No. 5,359,177, the microwave propagates through the microwave power feed window 143 contiguous with the E-plane 144 into the plasma producing ring 141.

The microwave causes microwave discharge in the plasma producing ring 141 to produce a microwave plasma in the plasma producing ring 141.

The frequency of the microwave energy is, for example, 2.45 GHz.

The H-plane 146 of the annular waveguide 147 may be in contact with the microwave power feed window 143.

In the third embodiment, the plasma jetted from the plasma producing ring 141 into the processing vessel 101 serves as a seed for initiating discharge between the electrode plates 103 and 104, and hence, discharge can be sustained even if the pressure in the processing vessel 101 is low. That is, discharge can be sustained even if the pressure in the processing chamber 101 is about $1.33 \times 10^{-1}$ Pa ($1 \times 10^{-3}$ Torr), at which ordinary parallel-plate discharge cannot be sustained.

Since the microwave discharge is able to produce a clean plasma in the plasma producing ring 141, the contamination of the workpiece and adhesion of dust can be reduced.

In the alternative, the processing vessels 101 of the first, the second and the third embodiments may be provided with a continuous slit in their side wall instead of the circular openings, and the plasma produced in the plasm producing vessel may be jetted through the slit into the processing vessels 101.

Although the present invention has been described as applied to plasma etching apparatuses, the plasma processing apparatus of the present invention may be any one of plasma CD apparatuses, plasma sputtering apparatuses and the like. If $SiH_4$ gas, i.e., a silane gas, is used as a CVD gas, $SiH_4$ has is decomposed by discharge and a silicon film can be deposited on a wafer.

The effects and the advantages of the present invention are summarized as follows.

As is apparent from the foregoing description, according to the first aspect of the present invention, in a plasma processing apparatus which applies RF power to upper and lower electrode plates, i.e., parallel plates, to produce a plasma by ionizing a process gas by discharge between the upper and lower electrode plates, the plasma source for producing the plasma is disposed so as to surround the upper and the lower electrode plates, and the plasma is supplied to the space between the upper and lower plates. Thus, the plasma can be confined in a space of a large area at a high vacuum and a wafer of a large diameter can be accurately and uniformly processed.

According to a second aspect of the present invention, the plasma processing apparatus comprises a processing vessel having a processing chamber containing an upper and a lower electrode plate. The plasma producing ring surrounds the processing vessel, defining the plasma producing chamber, and has openings in its inner wall open into the processing chamber, and has an RF power feed window ont he other side. An RF coil is disposed around the RF power fee window. A plasma produced in the plasma producing chamber by inductively coupled discharge caused by the RF coil and the RF power feed window is supplied through the openings into a space between the upper and the lower electrode plates in the processing chamber. A plasma of a high density can be supplied to the space between the upper and lower electrode plates, so that the workpiece can be processed at a high processing rate.

According to a third aspect of the present invention, the plasma processing apparatus comprises a processing vessel having a processing chamber containing upper and lower electrode plates. The plasma producing ring surrounds the processing chamber, defining the plasma producing chamber, and has openings in its inner wall open into the processing chamber, and is internally provided with an annular discharge electrode. The plasma produced in the plasma producing chamber by RF discharge between the wall of the plasma producing chamber and the annular discharge electrode is supplied through the openings into the space between the upper and lower electrode plates in the processing chamber. The plasma processing apparatus enhances the uniformity in the density of the plasma produced in the plasma producing chamber, so that the workpiece can be uniformly processed.

According to a fourth aspect of the present invention, the plasma processing apparatus comprises a processing vessel having a processing chamber containing upper and lower electrode plates. The plasma producing ring surrounds the processing vessel, defining the plasma producing chamber, and has openings in its inner wall open into the processing chamber. The plasma producing ring is provided with a microwave power feed window on the other side, and an annular waveguide surrounds the microwave power feed window. A plasma produced in the plasma producing chamber by a microwave propagating in the annular waveguide is supplied through the openings into the space between the upper and lower electrode plates in the processing chamber. The plasma processing apparatus produces a plasma of an increased density in the plasma producing chamber, to supply high-density plasma to the space between the upper and lower electrode plates in the processing chamber and to produce a clean plasma by microwave discharge in the plasma producing chamber. Thus, the contamination of the workpiece and adhesion of dust can be reduced and the workpiece can be processed with high quality.

According to a fifth aspect of the present invention, in the plasma processing apparatus according to any of the first to fourth aspects of the present invention, a process gas is supplied intermittently into the plasma producing chamber and, consequently, the plasma produced in the plasma producing chamber can be efficiently jetted into the processing chamber.

Obviously many modifications and variations of the present invention are possible in light of the above teachings. It is therefore to be understood that within the scope of the appended claims the invention may be practiced otherwise than specifically described.

We claim:

1. A plasma processing apparatus, comprising:
   a processing vessel having a processing chamber which contains an upper electrode plate and a lower electrode plate, said lower electrode plate disposed opposite and in parallel with said upper electrode plate, wherein a radio-frequency voltage is applied across said upper electrode plate and said lower electrode plate to produce and sustain a plasma by ionizing a process gas by discharge between said upper and lower electrode plates;

said plasma processing apparatus further comprising a plasma source disposed so as to surround said upper and said lower electrode plates to produce said plasma and to supply said plasma into a space between said upper and said lower electrode plates by a pressure difference between said space and said plasma source.

2. The plasma processing apparatus according to claim 1, wherein said plasma source comprises:

an annular plasma producing structure surrounding said processing chamber, wherein said annular plasma producing structure has at least one opening in an inner wall thereof open into said processing chamber, and said annular plasma producing structure has a radio-frequency power feed window on an other side thereof;

a radio-frequency coil disposed around said radio-frequency power feed window;

wherein said plasma is produced in said annular plasma producing structure by inductively coupled discharge caused by said radio-frequency coil and said radio-frequency power feed window, and is supplied through said at least one opening into said space between said upper and said lower electrode plates in said processing chamber.

3. The plasma processing apparatus according to claim 1, wherein said plasma source comprises:

an annular plasma producing structure surrounding said processing chamber, wherein said annular plasma producing structure has at least one opening in an inner wall thereof open into said processing chamber, and said annular plasma producing structure has an annular discharge electrode disposed opposite to said inner wall; and wherein said plasma is produced in said annular plasma producing structure by radio-frequency discharge between an inner wall of said plasma producing structure and said annular discharge electrode, and is supplied through said at least one opening into said space between said upper and said lower electrode plates in said processing chamber.

4. The plasma processing apparatus according to claim 1, wherein said plasma source comprises:

an annular plasma producing structure surrounding said processing chamber, wherein said annular plasma producing structure has at least one opening in an inner wall thereof open into said processing chamber, and said annular plasma producing structure has a microwave power feed window on an other side thereof, and an annular waveguide surrounding said microwave power feed window;

wherein said plasma is produced in said annular plasma producing structure by a microwave propagating through said annular waveguide, and is supplied through said at least one opening into said space between said upper and said lower electrode plates in said processing chamber.

5. The plasma processing apparatus according to claim 2, wherein said process gas is supplied intermittently into said processing chamber.

6. The plasma processing apparatus according to claim 3, wherein said process gas is supplied intermittently into said processing chamber.

7. The plasma processing apparatus according to claim 4, wherein said process gas is supplied intermittently into said processing chamber.

* * * * *